United States Patent [19]

Hall et al.

[11] Patent Number: 4,520,316

[45] Date of Patent: May 28, 1985

[54] NMR IMAGING TECHNIQUE

[75] Inventors: Laurance D. Hall; Subramaniam Sukumar, both of Vancouver, Canada

[73] Assignee: The University of British Columbia, Vancouver, Canada

[21] Appl. No.: 488,415

[22] Filed: Apr. 25, 1983

[51] Int. Cl.³ ............................................. G01R 33/08
[52] U.S. Cl. ...................................... 324/309; 324/307
[58] Field of Search ............... 324/307, 309, 310, 300, 324/312

[56] References Cited

U.S. PATENT DOCUMENTS

| | | | |
|---|---|---|---|
| 4,362,993 | 12/1982 | Young | 324/309 |
| 4,409,550 | 10/1983 | Fossel | 324/309 |
| 4,422,042 | 12/1983 | Sugimoto | 324/309 |
| 4,424,488 | 1/1984 | Hounsfield | 324/309 |
| 4,425,547 | 1/1984 | Sugimoto | 324/309 |
| 4,429,277 | 1/1984 | Sugimoto | 324/309 |
| 4,443,760 | 4/1984 | Edelstein | 324/309 |

Primary Examiner—Michael J. Tokar
Attorney, Agent, or Firm—Beehler, Pavitt, Siegemund, Jagger & Martella

[57] ABSTRACT

A method of obtaining an NMR spectrum for at least a portion of a specimen slice is provided. The method comprises acquiring a number of projections of the specimen slice and shifting the projections by $\Delta f$ for any point of interest. The shifted projections are then summed or compared to produce a resultant point spectrum. Preferably, shifted projections in each of a plurality of selected sets thereof are compared so as to produce a plurality of resultant spectra for the point which are used to produce a first iterated point spectrum. Additional stages of iteration are provided to minimize the effect of artifacts which comprises comparing aligned corresponding positions on an i iterated spectrum with a previously uncompared resultant point spectrum, so as to produce an i+1 iterated spectrum for the point, and repeating the foregoing a plurality of times, in each case using the iterated spectrum from the previous iteration as the i iterated spectrum.

27 Claims, 5 Drawing Figures

NMR IMAGING TECHNIQUE

FIELD OF THE INVENTION

This invention broadly relates to a method of obtaining a NMR spectrum of at least a portion of a specimen slice, and an apparatus for accomplishing the foregoing.

BACKGROUND OF THE INVENTION

NMR tomography particularly utilizing the projection-reconstruction imaging technique is well-known. In such a technique, a series of free induction decays (FID) is obtained usually with a suitable rf pulse sequence, while a magnetic field gradient is rotated through a number of angles in the image plane (which is assumed to be established by known means), each angular position corresponding to a given FID. The resulting FIDs are then Fourier transformed to yield a series of projections used to reconstruct the image. A difficulty with the foregoing method is that the field gradient necessarily causes broadening of particular chemical shifts in the image of the specimen slice, so that in a typical image of a specimen slice, particularly with biological specimens such as the human body, the various chemical shifts are not resolved, as the separations between the resonances are less than the broadening produced by the gradient in each projection. Methods have been suggested by Bendel et al in *J. Magn. Reson.*, 38 343 (1980) and by Lauterbur et al in *J. Amer. Chem. Soc.*, 97, 6866 (1975) which involve selective excitation or signal subtraction techniques which are not particularly applicable for complex systems, and require prior knowledge of the type of spectrum to be produced by the sample. In addition, a 'sensitive-point' method of obtaining spectra of individual points is known, but such involves acquiring data separately from a large number of points and hence is a relatively time consuming method. Other methods are known in NMR imaging which involve emphasizing $T_2$ (spin-spin relaxation) differences, and $T_1$ (spin-lattice relaxation) differences. However, these methods do not produce actual spectra of any given points or area in the image of the specimen slice.

SUMMARY OF THE INVENTION

The present invention provides a method which is relatively readily adapted to existing NMR tomographic scanners, and which is capable of producing spectra of any given point in the image of the specimen slice, the intensity distribution of a selected resonance within an area of the image of the specimen slice, or an entire NMR spectrum of the given area.

The method of the present invention broadly allows a user to obtain an NMR spectrum of at least a portion of a specimen slice. The method comprises acquiring n projections of the specimen slice where n is greater than 1, in a well-known manner. Each of the projections is then shifted by $\Delta f$ for the point (the frequency offset of the signal arising from the point, from the true chemical shift). In one embodiment of the invention n is much greater than one and the shifted projections are simply added. In another embodiment intensities of aligned positions at a plurality of locations along a first set of shifted projections are then compared, and the intensities thereof averaged when the differences therein are within a selected threshold value. The lower of the intensities is taken when the differences therein are greater than the threshold value. A resultant point spectrum is thereby produced for the point.

Preferably, the number of shifted projections in the first set is less than n. In addition, in such a case the method additionally comprises comparing the intensities of aligned positions at a plurality of locations along a resultant point spectrum and a projection outside the first set and averaging the intensities of the corresponding points when the differences are within a selected threshold value. When the differences are greater than the threshold value, the lower of the intensities is taken. In this manner, a first iterated point spectrum can be produced for the point.

In another embodiment of the method, n is greater than 3, and the intensities of aligned positions at a plurality of locations along shifted projections are compared within each of a plurality of selected sets of shifted projections, the 'comparison' being done in the manner previously described, so as to produce a plurality of resultant point spectra for the point. Additionally, intensities of aligned positions at a plurality of locations along resultant spectra of a first set of at least two thereof are compared in a manner as previously described, so as to produce a first iterated point spectrum for the point.

In a further embodiment of the above, n is greater than 7. This embodiment additionally comprises repetetively comparing intensities of aligned positions at a plurality of locations along an i iterated spectrum and a previously uncompared resultant point spectrum, the 'comparing' being done in the manner previously described, so as to produce an $i+1$ iterated point spectrum. The preceding step is then repeated a plurality of times in each case using the iterated spectrum from the previous iteration as the i iterated spectrum. Thus, for example a second iterated point spectrum would be compared in the foregoing manner to produce a third iterated spectrum for the point. The third iterated spectrum could then be further compared to produce a fourth iterated point spectrum, and so on.

Usefully, the number of shifted projections in the first set is $k_1$, with each shifted projection thereof being spaced apart from adjacent shifted back projections $360°/k_1$. More generally, the number of shifted projections in each set is $k_i$, each shifted projection thereof being spaced apart from adjacent shifted projections by $360°/k_i$. Preferably, $k_i=4$.

At least some of the iterated spectra are usefully displayed, for example either on a CRT display or by a plotter.

In a still further embodiment of the invention each of the steps is repeated for a plurality of respective points in an area so as to produce iterated point spectra for that area. The intensity distribution of a selected resonance within that area is then calculated and displayed. Alternatively, in a further embodiment of the method, each of the steps can be repeated for a plurality of respective points in an area so as to produce iterated point spectra for that area, followed by adding the point spectra for the area so as to produce a spectrum of the area which is then displayed.

The present invention also provides an apparatus for obtaining an NMR spectrum of at least a portion of an image slice. The apparatus comprises an NMR tomographic scanner of a type well-known (basically including the necessary magnetic field coils, rf transmitter and receiving coils, and associated hardware). The apparatus also comprises a display unit and a suitably programmed digital computer means connected between the scanner and the display unit, which operates the scanner and executes the method as described.

DRAWINGS

FIG. 1 shows a series of NMR projections of three tubes containing benzene, the image of which is shown below the projections; FIG. 2 shows a slice in the x-y plane of a test specimen comprising 7 capilliary tubes, each with different compounds and arranged as shown; FIG. 3 shows at the bottom a high resolution NMR spectrum of the specimen slice shown in FIG. 2, obtained by conventional means, while plots 1 to 7 and 1a, 3a, and 6a are point spectra obtained by the method of the present invention; FIG. 4 illustrates the spacing of line spectra along the specimen slice as shown in FIG. 5; and FIG. 5 shows at the bottom a high resolution NMR spectrum of the test specimen of FIGS. 4 and 1 obtained by conventional means, while plots a to d are line spectra along the y axis as shown in FIG. 4.

DETAILED DESCRIPTION OF EMBODIMENTS OF THE INVENTION

The present method depends on the fact that in the presence of a linear field gradient $G_{x,y}(\theta)$ the frequency offset ($\Delta f$) of a signal arising from any point $P_{x,y}$ in the image plane (and it is assumed an image plane has already been established by known means) from its true chemical shift is given by:

$$\Delta f = \gamma/2\pi G_{x,y}(\theta) [x \cos \theta + y \sin \theta]$$

where $\gamma$ is the gyromagnetic ratio, and $G_{x,y}(\theta)$ is the resultant of the two linear field gradients applied along the x and y axis ($\theta$ being the gradient direction with respect to the x-axis). Thus, where a plurality of projections are obtained for a given point on the image plane of the specimen, the signals from all the substances in that point are aligned along their respective chemical shift frequencies simply by shifting each of the projections by $\Delta f$. In a simple case, and providing a sufficiently large number of shifted projections are available for the point, the shifted projections can be simply summed to produce the corresponding NMR spectrum for the point (or 'point spectrum'), resonances from outside the point generally being spread along the baseline.

Figure 1:
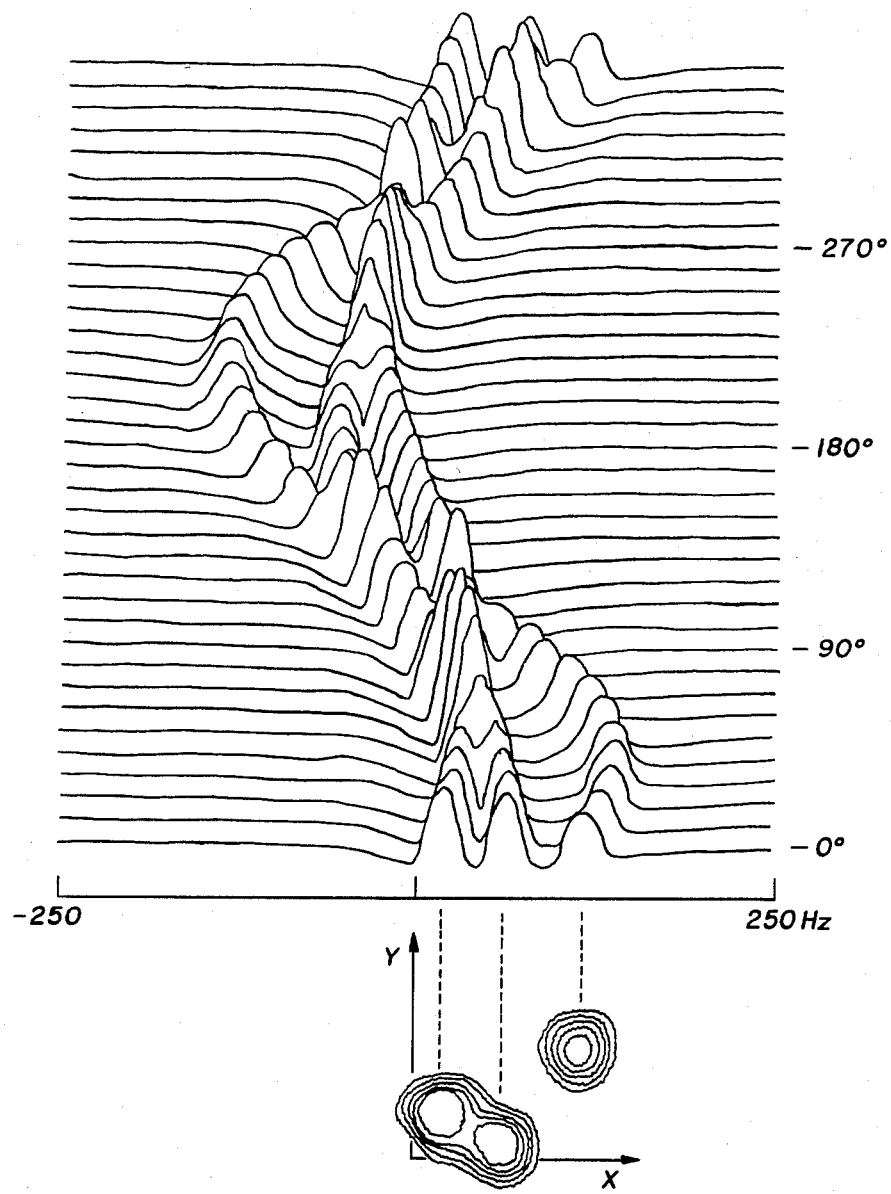

Referring to FIG. 1 it will be seen for the projections of the three benzene containing tubes, how a chemical shift for a given substance at a point is shifted by $\Delta f$ in the various projections. The present method basically utilizes the fact that when the projections are shifted $\Delta f$ for a particular tube or point, the signals from that tube will align while the remainder will vary randomly. However, signals outside the point of interest can produce artifacts where such signals are particularly intense and the projections are simply summed. Such artifacts can be minimized by 'comparing' the projections in a manner described below, and by use of an iterative method as described below.

In 'comparing' different projections of a first set thereof, the intensities of aligned positions (i.e. chemical shifts) on the projections of the set are compared at a plurality of positions along the projections. The average of the intensity of the corresponding positions is taken when the differences in the intensities are within a selected threshold value (which can be user defined in any particular application, including being zero). The lower of the intensities is taken when the differences therein are greater than the threshold value. In such a manner, a resultant iterated point spectrum can be produced for the point. However, it is usually necessary to perform further iteration to minimize artifacts. Preferably, this is accomplished by first obtaining a plurality of resultant point spectra for the point (any particular resultant point spectrum being referred to as Pm) by comparing the intensities of aligned positions at a plurality of locations along four 90° spaced apart shifted projections within each of a plurality of selected sets of four shifted projections, in the manner described foregoing. Aligned positions on a first set of at least two, resultant point spectra for the point are then compared in an analogous manner as for the projections, so as to produce a second iterated point spectrum for the point. Second or higher iterated point spectra for the point can be obtained by comparing in the manner described, aligned positions on the first or more generally the i, iterated spectrums with a previously uncompared resultant spectrum, so as to produce the second iterated point spectrum for the point, or generally an i+1 iterated spectrum for the point. Initially utilizing four projections equally spaced 90° apart assists in discriminating the signals from the artifacts.

It should be borne in mind in discussing the above comparison method that various weighted averages can be used with little effect on the end result in view of experimental error. Thus, when corresponding positions on an i iterated point spectrum are being compared with a previously uncompared first iterated point spectrum, it is possible simply to add to the i iterated spectrum the average value of the intensities when the difference are within a threshold value. To maintain a scale in such a procedure though, the resulting intensities should be divided by 2, as will be the lower of the intensities from corresponding positions when the differences thereof are greater than the threshold value.

The method which was used in the example to be described in connection with FIGS. 2 through 5, is described below. The method was executed on a programmed digital computer. Brackets are used to indicate intensities of spectra.

I First Iteration Step (i) define total area or image size;

(ii) define the area of interest in terms of x and y and length and width;

(iii) calculate $\Delta f$ for a point;

(iv) shift each projection by $\Delta f$ and save in the core memory;

(v) compare intensities of aligned positions at a location along a set of four shifted projections, each spaced apart from adjacent projections by 90°, by calculating the lowest of the four values;

(vi) (a) add the result from (v) to a resultant first iterated point spectrum for the point;

(b) if the lowest value is outside a baseline threshold value set as 0;

(vii) Repeat (v) to (vi) until all desired locations along the projections are iterated, storing results of (v) for all desired locations as a resultant spectrum, Pm;

(viii) repeat (iii) to (vii) till all projections are iterated;

(ix) repeat (iii) to (viii) till all points in the area of interest are iterated.

II Additional Iterations (i) intensities of aligned positions at a location along the i iterated spectrum for the point, $S_i$, and in a previously uncompared Pm are compared and the difference in intensities thereof calculated, namely the differences in intensity at that position, $|(Si)-(Pm)|=\delta$; if the lowest intensity at Si or Pm at that location is less than a baseline threshold value, set as 0;

(ii) if $\delta$ in (i) is greater than a threshold value, take the lower of (Si) and (Pm) at that position add to an i+1 iterated spectrum for the point, and divide the intensity by two for correct scaling;

(iii) if $\delta$ is within the threshold value, add the average of (Si) and (Pm) to the i+1 iterated spectrum for the point, and divide by two for correct scaling;

(iv) repeat (i) to (iii) for the next location along Si until all desired locations therealong are iterated;

(v) repeat (i) to (iv) until all Pm are iterated;

(vi) repeat (i) to (v) until all points in the area of interest are iterated;

(vii) repeat (i) to (vii) until all iterations are completed.

The number of iterations accomplished by the above method can be limited automatically by the program, or the user may view the resulting point spectrum at each stage of iteration and stop when there is essentially no change in the resulting spectrum. Alternatively, it should be possible for the program to automatically stop iterating when there is essentially no change in the resulting point spectrum. It should be noted of course that although in the step (v) of the first iteration the lowest value was taken, this step is analogous to step (i) of additional iterations in which the threshold has been defined as zero.

Figure 5:
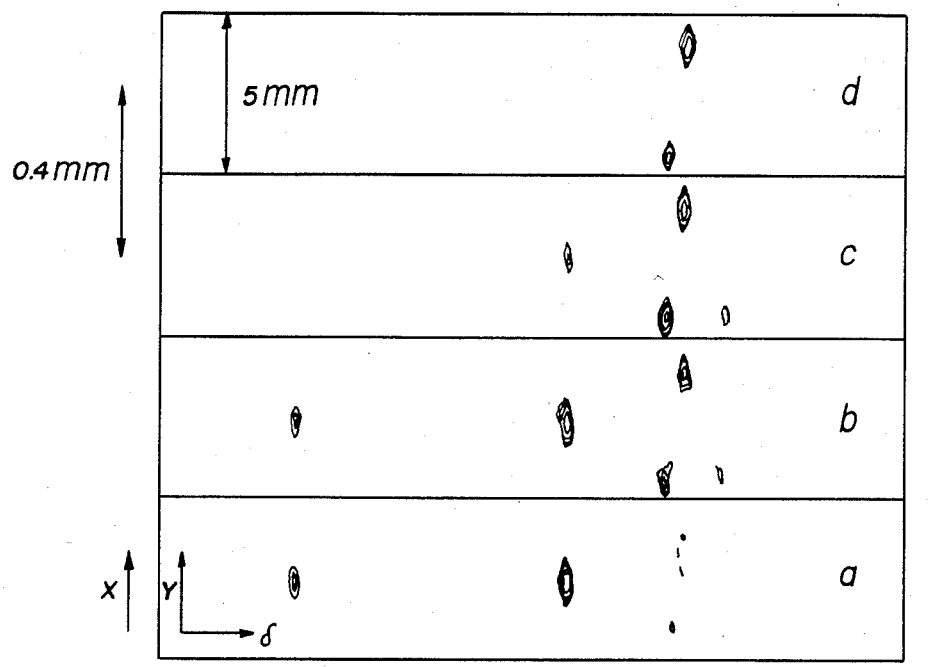
Figure 2:
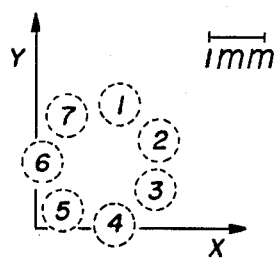

Referring now to FIG. 2, the test specimen was assembled from 7 capilliary tubes (0.8 mm ID, and 1.1 mm OD) containing the following:

| Test Tube No. | Contents | Designation in FIG. 5 |
|---|---|---|
| 1 | 1,1,2-Trichloroethane | 1, 1 |
| 2 | water | 2 |
| 3 | ethyl acetate | 3, 3, 3 |
| 4 | acetone | 4 |
| 5 | acetone | 5 |
| 5 | dimethyl sulfoxide | 5 |
| 6 | p-dioxane | 6 |
| 6 | impurities | 6, 6 |
| 7 | dimethyl sulfoxide | 7 |

Free induction decay signals for 72 different projections were acquired for the specimen slice during a total of 73 minutes. The experiment was performed on a home built 270 MHz spectrometer based on an Oxford Instruments narrow bore solenoid (6.2 T), and a Nicolet 1180/293 B pulse programmer. Other experimental parameters for the foregoing include:

spectral width = ±500 Hz.; block size (i.e. number of locations iterated along aligned projections or spectra) = 512 locations; number of acquisitions = 4; pulse width = 4 microseconds; acquisition time = 257 ms; relaxation delay between pulses = 15 seconds; field gradient = 0.1 G/cm. Both the gradient control and data processing were effected with software written in assembly language. The baseline threshold was set at zero, while the threshold $\delta$ for II(i) was set at 6.25% of the iterated spectrum. Fourier transformation of the 72 projection angles required a further two minutes. Calculation of traces 1 through 7 in FIG. 3, which are first iterated point spectra based on points 0.2 mm × 0.2 mm positioned at the centre of respective tubes, took about 7 seconds in total. As will be seen from FIG. 3, although traces 2, 4, 5 and 7 are acceptable, those of tubes 1, 3 and 6 show substantial artifacts. As shown by the traces on the right, these artifacts are completely eliminated by a second iterative step using the method described above. As will be seen from FIG. 3, good chemical shift and spatial resolution is achieved by the above method. For example note the resolution of the methylene proton in methylacetate from the water (traces 3 and 2 respectively) in FIG. 3.

It will of course be appreciated from the above that once point spectra for a plurality of respective points in an area have been obtained, it is a straightforward matter to use a computer to calculate the intensity distribution of a selected resonance within that area.

Figure 4:
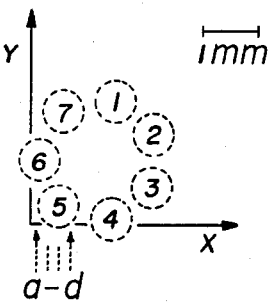
Figure 3:
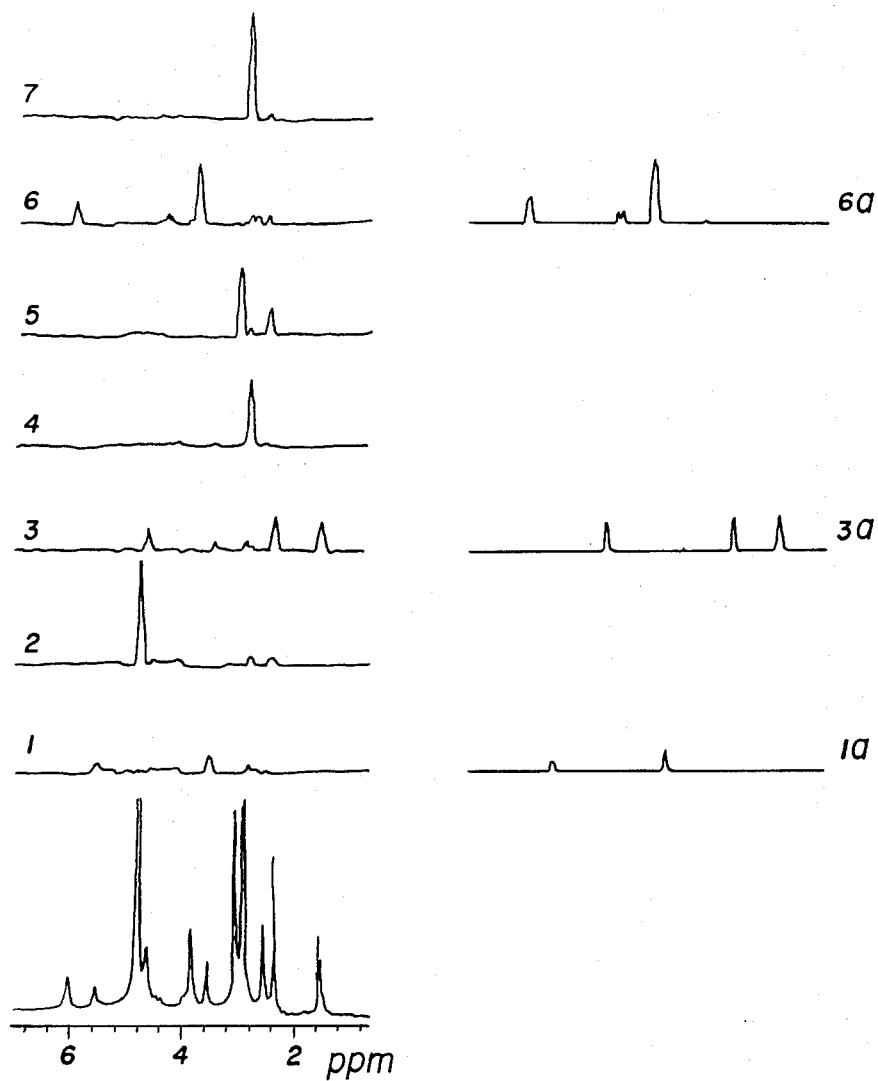

Referring now to FIGS. 4 and 5, FIG. 5 in particular shows contour plots a to d calculated from the data obtained in the preceding experiment, which represent line spectra along the y axis, and each of about 0.4 mm in thickness along the x axis. Each of the spectra was taken at intervals as shown in FIG. 4. The contour plots a to d then correspond to an NMR spectrum showing four dimensions, namely x and y spatial coordinates, chemical shifts, and intensities.

As will be apparent to those skilled in the art in light of the foregoing disclosure, many alterations and modifications are possible in the practice of this invention without departing from the spirit or scope thereof. Accordingly, the scope of the invention is to be construed in accordance with the substance defined by the following claims.

We claim:

1. A method of obtaining an NMR spectrum for at least a portion of a specimen slice, comprising:

(a) acquiring n projections of the specimen slice, where n >> 1;

(b) shifting the projections $\Delta f$ for a point in the specimen slice; and (c) summing the shifted projections so as to produce a point spectrum for the point.

2. A method of obtaining an NMR spectrum of at least a portion of a specimen slice, comprising:

(a) acquiring n projections of the specimen slice, where n > 1;

(b) shifting the projections $\Delta f$ for a point in the specimen slice; and (c) comparing intensities of aligned positions at a plurality of locations along a first set of shifted projections and averaging the intensities thereof when the differences therein are within a selected threshold value, and taking the lower of the intensities when the differences therein are greater than the threshold value, so as to produce a resultant point spectrum for the point.

3. A method as described in claim 2 wherein the number of shifted projections in the first set is less than n, the method additionally comprising comparing the intensities of aligned positions at a plurality of locations along a resultant point spectrum and a projection outside the first set and averaging the intensities thereof when the differences therein are within a selected threshold value, and taking the lower of the intensities when the differences therein are greater than the threshold value, so as to produce a first iterated point spectrum for the point.

4. A method of obtaining an NMR spectrum of at least a portion of a specimen slice, comprising:

(a) acquiring n projections of the specimen slice, where n > 3;

(b) shifting the projections Δf for a point in the specimen slice;

(c) comparing intensities of aligned positions at a plurality of locations along shifted projections within each of a plurality of selected sets of shifted projections, and averaging the intensities thereof when the differences in intensities of corresponding positions are within a selected threshold value, and taking the lower of the intensities when the differences therein are greater than the threshold value, so as to produce a plurality of resultant spectra for the point; and (d) comparing intensities of aligned positions at a plurality of locations along resultant spectra of a first set of at least two thereof and averaging the intensities thereof when the differences in intensities of corresponding positions are within a selected threshold value, and taking the lower of the intensities when the differences are greater than the threshold value, so as to produce a first iterated spectrum for the point.

5. A method as described in claim 4 wherein $n > 7$ and additionally comprising:

(e) repetitively comparing intensities of aligned positions at a plurality of locations along an i iterated spectrum and a previously uncompared resultant point spectrum, and averaging the intensities of corresponding positions when the differences therein are less than a threshold value, and taking the lower of the intensities when the differences are greater than the threshold value, so as to produce an $i+1$ iterated spectrum for the point; and (f) repeating the preceding step a plurality of times, in each case using the iterated spectrum from the previous iteration as the iterated spectrum.

6. A method as described in claim 2 wherein the number of shifted projections in the first set is $k_1$, each shifted projection thereof being spaced apart from adjacent shifted projections $360°/k_1$.

7. A method as described in claim 3 wherein the number of shifted projections in the first set is $k_1$, each shifted projection thereof being spaced apart from adjacent shifted projections $360°/k_1$.

8. A method as described in claim 4 wherein the number of shifted projections in each set is $k_i$, each shifted projection thereof being spaced apart from adjacent shifted projections by $360°/k_i$.

9. A method as described in claim 5 wherein the number of shifted projections in each set is $k_i$, each shifted projection thereof being spaced apart from adjacent shifted projections by $360°/k_i$.

10. A method as described in claim 9 wherein $k_i = 4$.

11. A method as described in claim 2 additionally comprising displaying at least some of the iterated spectra.

12. A method as described in claim 3 additionally comprising displaying at least some of the iterated spectra.

13. A method as described in claim 4 additionally comprising displaying at least some of the iterated spectra.

14. A method as described in claim 5 additionally comprising displaying at least some of the iterated spectra.

15. A method as described in claim 8 additionally comprising displaying at least some of the iterated spectra.

16. A method as described in claim 10 additionally comprising displaying at least some of the iterated spectra.

17. A method as described in claim 2 additionally comprising:

(a) repeating each of the steps for a plurality of respective points in an area so as to produce iterated spectra for that area;

(b) calculating the intensity distribution of a selected resonance within that area; and (c) displaying the intensity distribution of the selected resonance within that area.

18. A method as described in claim 3 additionally comprising:

(a) repeating each of the steps for a plurality of respective points in an area so as to produce iterated spectra for that area;

(b) calculating the intensity distribution of a selected resonance within that area; and (c) displaying the intensity distribution of the selected resonance within that area.

19. A method as described in claim 4 additionally comprising:

(a) repeating each of the steps for a plurality of respective points in an area so as to produce iterated spectra for that area;

(b) calculating the intensity distribution of a selected resonance within that area; and (c) displaying the intensity distribution of the selected resonance within that area.

20. A method as described in claim 5 additionally comprising:

(a) repeating each of the steps for a plurality of respective points in an area so as to produce iterated spectra for that area;

(b) calculating the intensity distribution of a selected resonance within that area; and (c) displaying the intensity distribution of the selected resonance within that area.

21. A method as described in claim 8 additionally comprising:

(a) repeating each of the steps for a plurality of respective points in an area so as to produce iterated spectra for that area;

(b) calculating the intensity distribution of a selected resonance within that area; and (c) displaying the intensity distribution of the selected resonance within that area.

22. A method as described in claim 10 additionally comprising:

(a) repeating each of the steps for a plurality of respective points in an area so as to produce iterated spectra for that area;

(b) calculating the intensity distribution of a selected resonance within that area; and (c) displaying the intensity distribution of the selected resonance within that area.

23. A method as described in claim 8 additionally comprising:

(a) repeating each of the steps for a plurality of respective points in an area so as to produce iterated spectra for that area;

(b) adding the point spectra for the area so as to produce a spectrum of the area; and (c) displaying the spectrum of the area.

24. A method as described in claim 10 additionally comprising:

(a) repeating each of the steps for a plurality of respective points in an area so as to produce iterated spectra for that area;

(b) adding the point spectra for the area so as to produce a spectrum of the area; and
(c) displaying the spectrum of the area.

25. An apparatus for obtaining an NMR spectrum of at least a portion of an image slice, comprising:
(a) an NMR tomographic scanner;
(b) a display unit; and
(c) a suitably programmed digital computer means connected between said scanner and said display unit, for operating said scanner and executing the method of claim 16.

26. An apparatus for obtaining an NMR spectrum of at least a portion of an image slice, comprising:
(a) an NMR tomographic scanner;
(b) a display unit; and
(c) a suitably programmed digital computer means connected between said scanner and said display unit, for operating said scanner and executing the method of claim 21.

27. An apparatus for obtaining an NMR spectrum of at least a portion of an image slice, comprising:
(a) an NMR tomographic scanner;
(b) a display unit; and
(c) a suitably programmed digital computer means connected between said scanner and said display unit, for operating said scanner and executing the method of claim 22.

* * * * *